(12) United States Patent
Huang et al.

(10) Patent No.: US 7,566,950 B2
(45) Date of Patent: Jul. 28, 2009

(54) FLEXIBLE PIXEL ARRAY SUBSTRATE

(75) Inventors: Chin-Jen Huang, Kaohsiung (TW);
Jung-Fang Chang, Tainan County (TW); Yih-Rong Luo, Taoyuan County (TW); Yu-Hung Chen, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 259 days.

(21) Appl. No.: 11/164,408

(22) Filed: Nov. 22, 2005

(65) Prior Publication Data
US 2007/0059854 A1   Mar. 15, 2007

(30) Foreign Application Priority Data
Sep. 14, 2005   (TW) .............................. 94131598 A

(51) Int. Cl.
*H01L 23/14* (2006.01)
(52) U.S. Cl. .................. 257/637; 257/52; 257/638; 257/639; 257/640; 257/641; 257/E51.005; 257/E29.151; 313/511

(58) Field of Classification Search ................... 257/40, 257/52, 635, 637–642, E29.051, E51.005; 313/511
See application file for complete search history.

(56) References Cited

U.S. PATENT DOCUMENTS
2006/0180815 A1* 8/2006 Sarma et al. .................. 257/66

* cited by examiner

*Primary Examiner*—Wael Fahmy
*Assistant Examiner*—Minchul Yang
(74) *Attorney, Agent, or Firm*—Jianq Chyun IP Office

(57) ABSTRACT

The present invention provides a method for fabricating a flexible pixel array substrate as follows. First, a release layer is formed on a rigid substrate. Next, on the release layer, a polymer film is formed, the adhesive strength between the rigid substrate and the release layer being higher than that between the release layer and the polymer film. The polymer film is formed by spin coating a polymer monomer and performing a curing process to form a polymer layer. Afterwards, a pixel array is formed on the polymer film. The polymer film with the pixel array formed thereon is separated from the rigid substrate.

6 Claims, 4 Drawing Sheets

FLEXIBLE PIXEL ARRAY SUBSTRATE

CROSS-REFERENCE TO RELATED APPLICATION

This application claims the priority benefit of Taiwan application serial no. 94131598, filed on Sep. 14, 2005. All disclosure of the Taiwan application is incorporated herein by reference.

BACKGROUND OF THE INVENTION

1. Field of Invention

The present invention relates to a pixel array substrate and a method for fabricating the same, and particularly to a flexible pixel array substrate and a method for fabricating the same.

2. Description of the Related Art

Along with the trend of bigger screen, flat panel displays (FPD) are developing towards lighter, thinner and flexible design as the foremost goal for the future. Therefore, flat panel displays (FPD) using a plastic substrate are becoming mainstream products for the displays of the next generation. To fabricate a pixel array substrate of a flexible FPD today, a plastic substrate is affixed on a glass substrate, then the pixel structures are formed on the plastic substrate. Although such sheet to sheet process can generally meet the fabrication requirements, how to efficiently separate the plastic substrate from the glass substrate after the pixel structures are formed becomes an inevitable problem.

Besides, the plastic substrate itself is relatively soft, which makes it harder to control during the fabrication process. To overcome the problem, another roll to roll process is introduced. Unfortunately, the relevant process and equipments to adapt the roll to roll process are still under development, and the feasibility is still being reviewed. Generally speaking, the sheet to sheet process for fabricating flexible FPDs is more realistic and feasible. Therefore, how to conveniently and quickly separate the plastic substrate from the glass substrate becomes a crucial technique to be overcome.

Furthermore, the material used by the plastic substrate currently does not have sufficient resistance to water vapor and oxygen, which limits the application flexibility of the FPD and even adversely affects its lifespan.

SUMMARY OF THE INVENTION

An objective of the present invention is to provide a method for fabricating a flexible pixel array substrate, to resolve the difficulty of separating the flexible pixel array substrate from the glass substrate in the prior art.

Another objective of the present invention is to provide a flexible pixel array substrate having sufficient resistance to water vapor and oxygen.

The present invention provides a method for fabricating a flexible pixel array substrate as follows. First, a release layer is formed on a rigid substrate. Next, a polymer film is formed on the release layer, wherein the adhesive strength between the rigid substrate and the release layer is higher than that between the release layer and the polymer film. For example, the formation of the polymer film includes spin coating a polymer monomer and performing a curing process to form a polymer layer. Further, a pixel array is formed on the polymer film. The polymer film with the pixel array formed thereon is separated from the rigid substrate.

According an embodiment of the present invention, the material of the above-described release layer includes metal, inorganic compound or polymer.

According to an embodiment of the present invention, after forming the release layer, the method further includes forming at least one film layer on the release layer.

According to an embodiment of the present invention, the above-mentioned film layer includes a hard coating layer, which is made of oxide or nitride.

According to an embodiment of the present invention, the above-mentioned film layer includes a water vapor-resistant and oxygen-resistant layer, which is made of oxide, nitride, polymer or a multi-layer combination of the above materials.

According to an embodiment of the present invention, the above-mentioned film layer includes an adhesive layer.

According to an embodiment of the present invention, the method for separating the polymer film with the pixel array formed thereon from the rigid substrate includes a curing process.

According to an embodiment of the present invention, the above-mentioned pixel array includes an amorphous silicon TFT array (a-Si TFT array), a low-temperature poly silicon TFT array (LTPS TFT array) or an organic TFT array.

According to an embodiment of the present invention, the above-mentioned rigid substrate includes a glass substrate.

The present invention further provides a flexible pixel array substrate, which includes a flexible substrate having an upper surface and a lower surface; a pixel array disposed on the upper surface of the flexible substrate; and at least one film layer disposed on the lower surface of the flexible substrate.

According to the flexible pixel array substrate in an embodiment of the present invention, the above mentioned film layer includes an adhesive layer, a hard coating layer, a water vapor-resistant and oxygen-resistant layer or a combination of the above layers.

According to the flexible pixel array substrate in an embodiment of the present invention, the above-mentioned hard coating layer is made of oxide or nitride.

According to the flexible pixel array substrate in an embodiment of the present invention, the above mentioned water vapor-resistant and oxygen-resistant layer is made of oxide, nitride, polymer or a multi-layer combination of the above materials.

According to the flexible pixel array substrate in an embodiment of the present invention, the above-mentioned pixel array includes an amorphous silicon TFT array (a-Si TFT array), a low-temperature poly silicon TFT array (LTPS TFT array) or an organic TFT array.

According to the flexible pixel array substrate in an embodiment of the present invention, the material of the above-mentioned flexible substrate includes a transparent polymer material.

The present invention features a release layer formed between the rigid substrate and the polymer film, wherein the adhesive strength between the rigid substrate and the release layer is higher than that between the release layer and the polymer film. Thus, when the subsequent processes are completed, the polymer film is able to be separated from the rigid substrate easily and quickly.

Moreover, the lower surface of the flexible substrate is covered by a water vapor-resistant and oxygen-resistant film layer, which enables the flexible pixel array substrate of the present invention for broader applications and prolongs its lifespan.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1A:
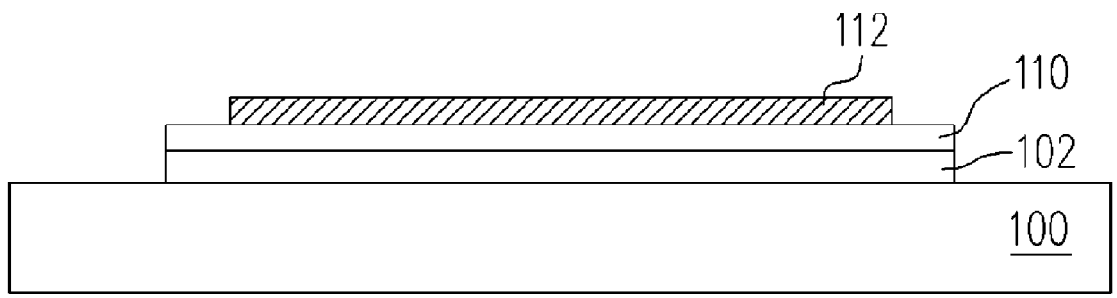
FIGS. 1A and 1B are schematic cross-sectional views of the fabricating process of a flexible pixel array substrate according to an embodiment of the present invention.
Figure 1B:
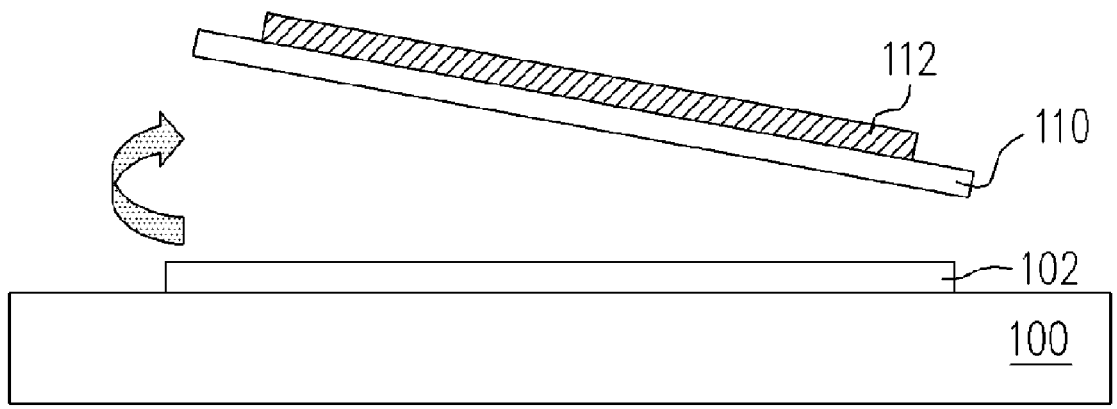

FIGS. 1A and 1B are schematic cross-sectional views of the fabricating process of a flexible pixel array substrate according to an embodiment of the present invention. Referring to FIG. 1A, a rigid substrate 100 is provided, first. The rigid substrate 100 is, for example, a glass substrate or other substrates with certain rigidity. The rigidity of the rigid substrate 100 must be sufficient to maintain the original shape of the rigid substrate 100 during transportation for better control.

Next, on the rigid substrate 100, a release layer 102 is formed. The material of the release layer 102 includes metal, inorganic compound or polymer. Afterwards, on the release layer 102, a polymer film 110 is formed, wherein the adhesive strength between the rigid substrate 100 and the release layer 102 is higher than that between the release layer 102 and the polymer film 110. In an embodiment, the material of the polymer film 110 includes a transparent polymer material, such as transparent polyimide (PI) or other transparent plastic. The formation of the polymer film includes, for example, spin coating a polymer monomer onto the release layer 102 and then performing a curing process to form a polymer layer. In the present invention, the material of the release layer 102 is not limited to one, but depends on the chosen materials of the rigid substrate 100 and the polymer film 110. The criteria of choosing the material of the release layer 102 is that the adhesive strength between the rigid substrate 100 and the release layer 102 is higher than that between the release layer 102 and the polymer film 110. The material of the release layer 102 includes products available in the market, such as the release films produced by Richmond Products Inc. USA, A5000, VAC-PAK A6200, E3760, VAC-PAK E4760 and E2760.

Figure 4:
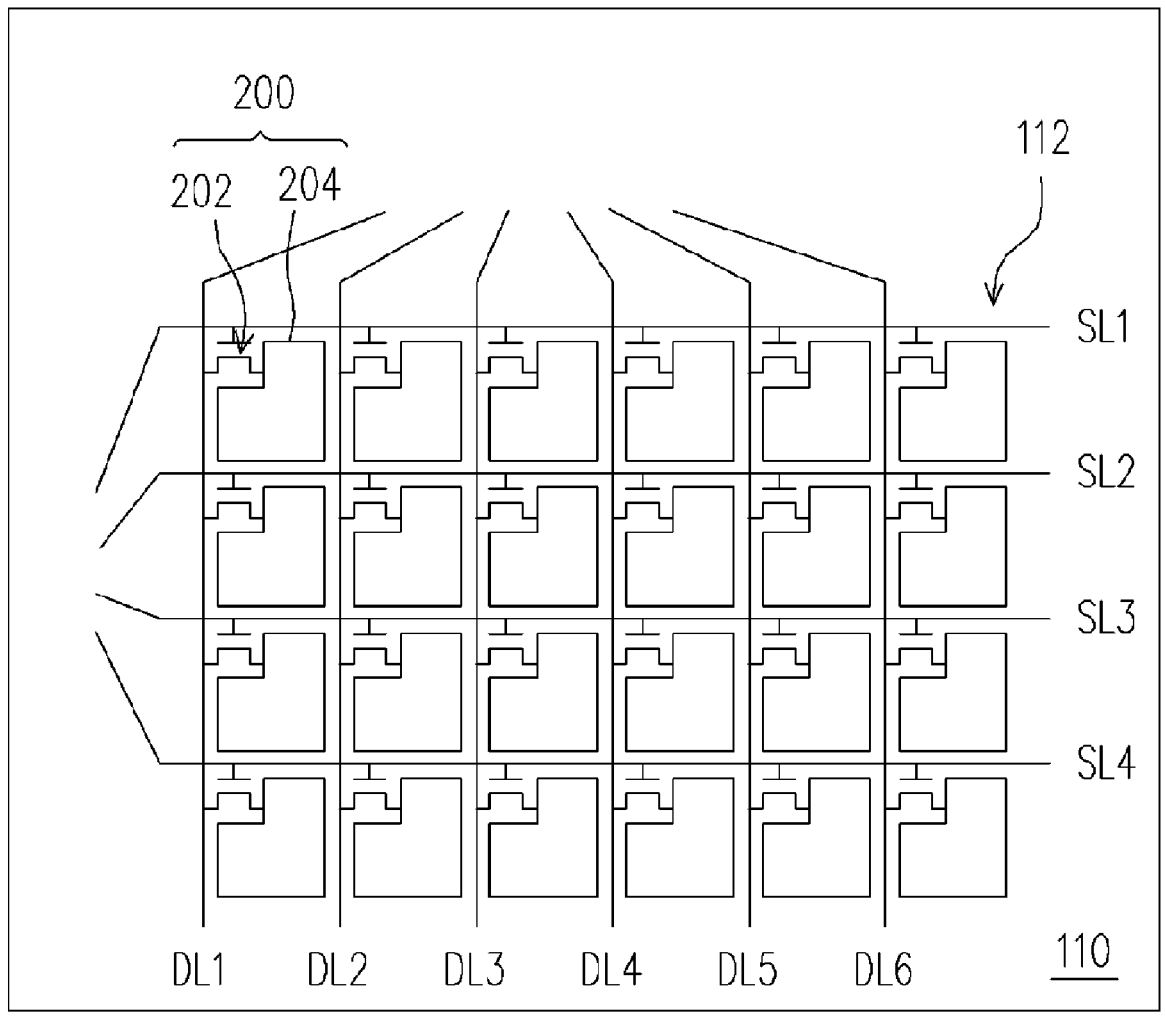
FIG. 4 is a pixel array diagram.

Further, after forming the polymer film 110, a pixel array 112 is formed on the polymer film 110. The pixel array 112 includes an amorphous silicon TFT array (a-Si TFT array), a low-temperature poly silicon TFT array (LTPS TFT array) or an organic TFT array. In an embodiment, the structural top view of the pixel array 112 formed on the polymer film 110 is shown in FIG. 4, where the pixel array 112 includes a plurality of scanning lines SL1~SL4, a plurality of data lines DL1~DL6 and a plurality of pixel units 200. Each pixel unit 200 is electrically connected to one of the scanning lines SL1~SL4 and to one of the data lines DL1~DL6 and includes a transistor 202 and a pixel electrode 204. Besides, the scanning lines SL1~SL4 and the data lines DL1~DL6 would extend to a peripheral zone of the entire structure for electrically connecting to a driving circuit (not shown in FIG. 4).

Note that if the fabricated pixel array 112 is to be used in a LCD display, after forming the pixel array 112, the process further includes forming film layers on the pixel array 112, such as a planarized layer or an alignment film. On the other hand, if the fabricated pixel array 112 is to be used in an organic electroluminescent display panel (OELD panel), after forming the pixel array 112, the process further includes forming film layers on the pixel array 112, such as an organic emitting layer and an electrode layer, etc.

Furthermore, referring to FIG. 1B, after forming the pixel array 112, the polymer film 110 with the formed pixel array 112 will be separated from the rigid substrate 100. The polymer film 110 separated from the rigid substrate 100, is the so-called flexible substrate. In an embodiment, the method for separating the polymer film 110 from the rigid substrate 100 includes a curing process. The adhesive strength between the rigid substrate 100 and the release layer 102 is higher than that between the release layer 102 and the polymer film 110, which enables the polymer film 110 to be separated from the rigid substrate 100 easily and quickly.

The present invention allows other film layers to be formed between the polymer film 110 and the release layer 102 (refer to the following description), where the adhesive strength between the rigid substrate 100 and the release layer 102 is higher than that between the release layer 102 and the formed film layer contacting the release layer 102.

Figure 2A:
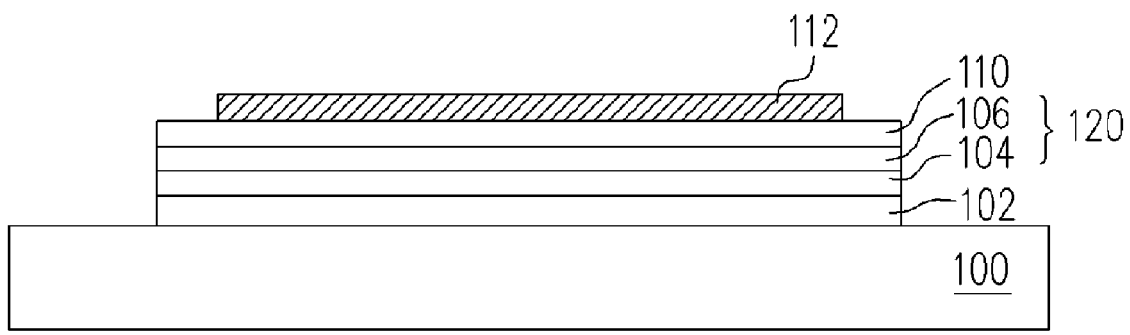
FIGS. 2A and 2B are schematic cross-sectional views of the fabricating process of a flexible pixel array substrate according to another embodiment of the present invention.
Figure 2B:
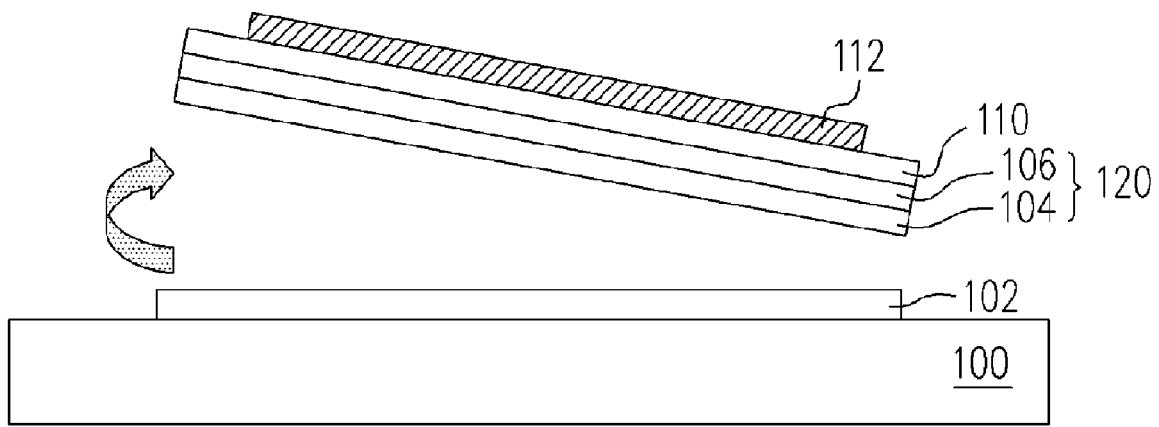

Referring to FIGS. 2A and 2B, schematic cross-sectional views of the fabricating process of a flexible pixel array substrate are shown according to another embodiment of the present invention. In FIG. 2A, after forming the release layer 102 on the rigid substrate 100, at least one film layer 120 is further formed on the release layer 102, then a polymer film layer 110 is formed on the film layer 120 and furthermore a pixel array 112 is formed on the polymer film layer 110.

In an embodiment, the above-mentioned film layer 120 includes a hard coating layer 104, which is made of oxide or nitride. According to another embodiment, the film layer 120 further includes a water vapor-resistant and oxygen-resistant layer 106 and the material thereof includes oxide, nitride, polymer or a multi-layer combination of the above materials.

Similarly, referring to FIG. 2B, after completing the pixel array 112, the polymer film 110 with the formed pixel array 112 will be separated from the rigid substrate 100. The polymer film 110 separated from the rigid substrate 100 is a so-called flexible substrate.

In particular, note that the pixel array 112 is formed on the upper surface of the flexible substrate 110, while the lower surface of the flexible substrate 110 is covered by the film layer 120. Since the lower surface of the flexible substrate 110 made of polymer is covered by a water vapor-resistant and oxygen-resistant film layer, the flexible pixel array substrate provided by the present invention accordingly has better water vapor-resistant and oxygen-resistant properties, which enables the flexible pixel array substrate of the present invention for broader applications and prolongs its lifespan.

Figure 3A:
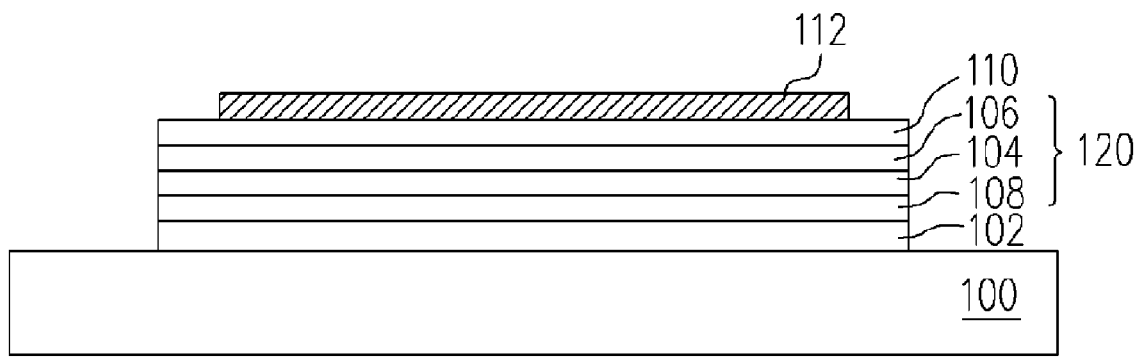
FIGS. 3A and 3B are schematic cross-sectional views of the fabrication process of a flexible pixel array substrate according to yet another embodiment of the present invention.
Figure 3B:
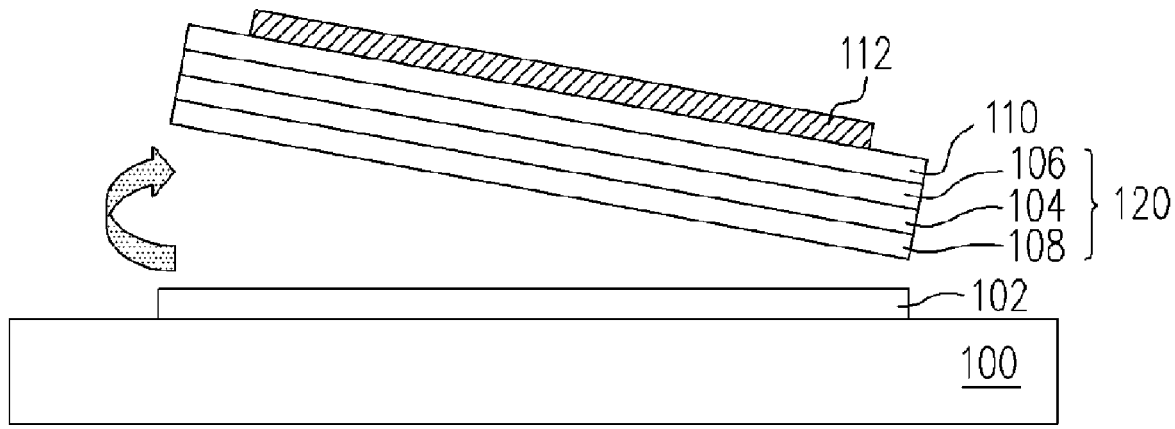

In addition to the hard coating layer 104 and the water vapor-resistant and oxygen-resistant layer 106 formed between the polymer film 110 and the release layer 102, other film layers can also be formed depending on the actual requirement. FIGS. 3A and 3B are schematic cross-sectional views of the fabricating process of a flexible pixel array substrate according to yet another embodiment of the present invention. In FIG. 3A, the film layer 120 formed between the polymer film 110 and the release layer 102 further includes an adhesive layer 108, such as a transparent adhesive layer, in addition to the above-mentioned hard coating layer 104 and the water vapor-resistant and oxygen-resistant layer 106. The adhesive layer 108 serves for increasing the adhesive strength between the film layers under the polymer film 110 such as the hard coating layer 104, and the release layer 102 to prevent the film layers on the rigid substrate 100 from falling off during the pixel array fabricating process. Herein, although the adhesive strength between the film layers under the polymer film 110 and the release layer 102 is increased, the adhesive strength between the release layer 102 and the rigid substrate 100 is still higher than that between the release layer 102 and the adhesive layer 108.

After completing the pixel array 112, referring to FIG. 3B, the polymer film 110 with the formed pixel array 112 will be separated from the rigid substrate 100. The polymer film 110 separated from the rigid substrate 100, is the so-called flexible substrate. Since the adhesive strength between the release layer 102 and the rigid substrate 100 is higher than that between the release layer 102 and the adhesive layer 108, it enables the polymer film 110 to be separated from the rigid substrate 100 easily and quickly. The adhesive layer 108 will be separated from the polymer film 110 by chemical etching or mechanical release method, however, the adhesive layer 108 may be remained on the film layer 120 after some treatments processes are performed to remove the adhesive strength of the bottom surface of the adhesive layer 108.

Similarly, the pixel array 112 is formed on the upper surface of the flexible substrate 110, while the lower surface of the flexible substrate 110 is covered by the film layer 120. Since the lower surface of the flexible substrate 110 made of polymer is covered by a water vapor-resistant and oxygen-resistant film layer, the flexible pixel array substrate provided by the present invention accordingly has better water vapor-resistant and oxygen-resistant properties, which enables the flexible pixel array substrate of the present invention for broader applications and prolongs its lifespan.

The flexible pixel array substrate separated from the rigid substrate will be assembled with another substrate, such as a color filter substrate (CFS), to form a LCD display panel later. Alternatively, the separated flexible pixel array substrate will pass a packaging process or a packaging lid process to form an organic electroluminescent display panel (OELD panel).

The method for fabricating flexible pixel array substrates of the present invention features a release layer formed between the rigid substrate and the polymer film, wherein the adhesive strength between the rigid substrate and the release layer is higher than that between the release layer and the polymer film (or the film layer formed on the release layer).

Thus, when the subsequent processes are completed, the polymer film is able to be separated from the rigid substrate easily and quickly.

Moreover, in the flexible pixel array substrates of the present invention, the surface of the flexible substrate made of polymer is covered by a water vapor-resistant and oxygen-resistant film layer, which ensures the flexible pixel array substrate to have better water vapor-resistant and oxygen-resistant properties and ensures the flexible pixel array substrate of the present invention for broader applications and prolongs its lifespan.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A flexible pixel array substrate on a rigid substrate, comprising:
   a flexible substrate, on the rigid substrate and having an upper surface and a lower surface;
   a pixel array, disposed on the upper surface of the flexible substrate;
   at least one film layer, disposed between the lower surface of the flexible substrate and the rigid substrate;
   an adhesive layer, between the at least one film layer and the rigid substrate; and
   a release layer, between the adhesive layer and the rigid substrate, wherein the adhesive strength between the release layer and the rigid substrate is higher than that between the release layer and the adhesive layer.

2. The flexible pixel array substrate of claim 1, wherein the film layer comprises a hard coating layer, a water vapor-resistant and oxygen-resistant layer or a combination thereof.

3. The flexible pixel array substrate of claim 2, wherein the material of the hard coating layer comprises oxide or nitride.

4. The flexible pixel array substrate of claim 2, wherein the material of the water vapor-resistant and oxygen-resistant layer comprises oxide, nitride, polymer or a multi-layer combination of the above materials.

5. The flexible pixel array substrate of claim 1, wherein the pixel array comprises an amorphous silicon TFT array (a-Si TFT array), a low-temperature poly silicon TFT array (LTPS TFT array) or an organic TFT array.

6. The flexible pixel array substrate of claim 1, wherein the flexible substrate comprises a transparent polymer material.

* * * * *